United States Patent [19]

Griffin et al.

[11] 4,378,139

[45] Mar. 29, 1983

[54] INTEGRATED CIRCUIT CARRIER CONNECTOR

[75] Inventors: Wendell L. Griffin; Donald E. Ralstin, both of South Bend, Ind.

[73] Assignee: Wells Electronics, Inc., South Bend, Ind.

[21] Appl. No.: 283,127

[22] Filed: Jul. 14, 1981

[51] Int. Cl.³ .............................. H01R 23/72
[52] U.S. Cl. .................. 339/75 MP; 339/17 CF; 339/176 MP
[58] Field of Search .......... 339/17 CF, 75 M, 75 MP, 339/176 MP; 174/52 FP

[56] References Cited

U.S. PATENT DOCUMENTS

| | | | |
|---|---|---|---|
| 3,409,861 | 11/1968 | Barnes et al. | 339/17 CF |
| 3,771,109 | 11/1973 | Bruckner et al. | 339/17 CF |
| 3,942,854 | 3/1976 | Klein et al. | 339/17 CF |
| 4,130,327 | 12/1978 | Spaulding | 339/75 M |
| 4,189,201 | 2/1980 | Romania | 339/75 MP |
| 4,278,311 | 7/1981 | Scheingold et al. | 339/17 CF |
| 4,341,433 | 7/1982 | Cherian et al. | 339/176 MP |

Primary Examiner—John McQuade
Attorney, Agent, or Firm—James D. Hall

[57] ABSTRACT

An electrical connector which is for accommodating integrated circuit carriers and which includes opposed latches used to secure the carrier to the connector frame by individual over-center securement.

4 Claims, 8 Drawing Figures

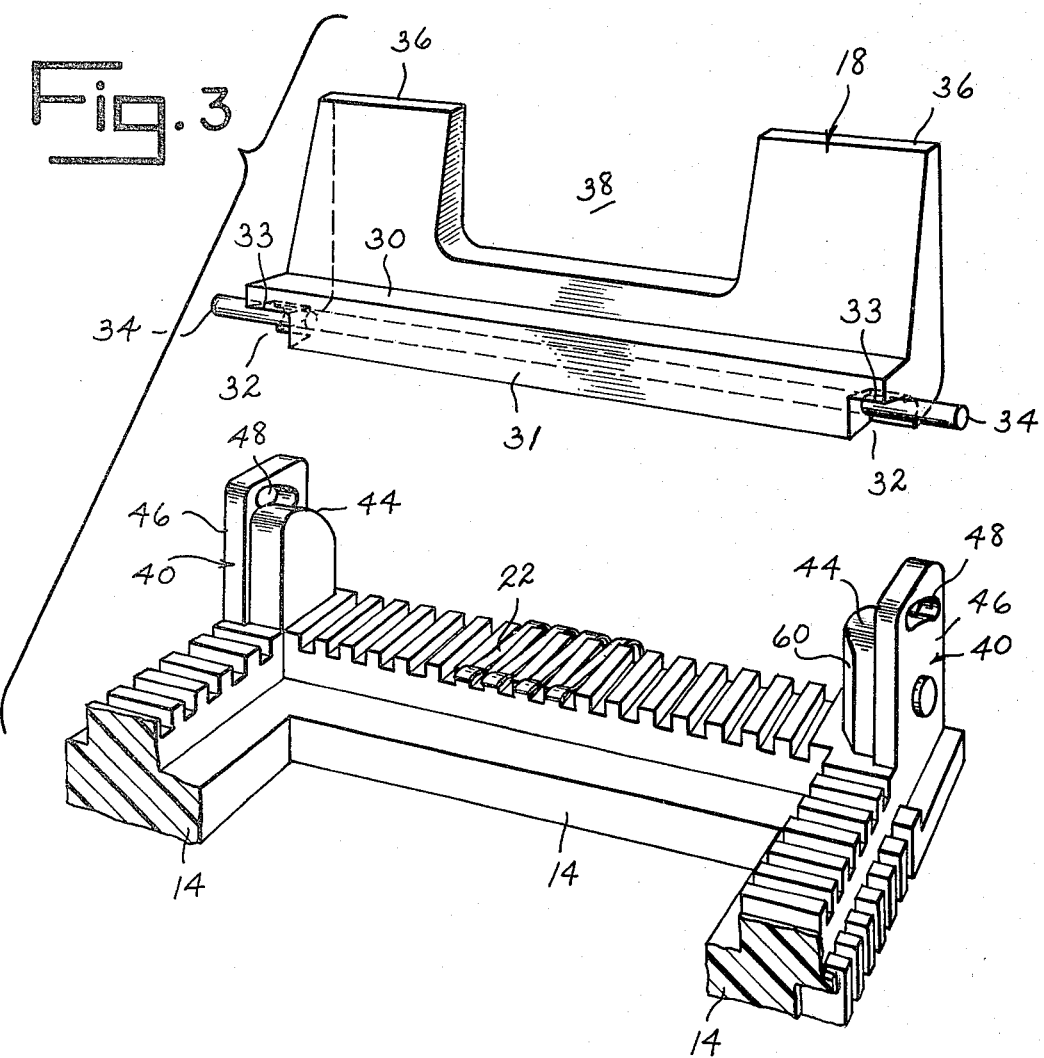
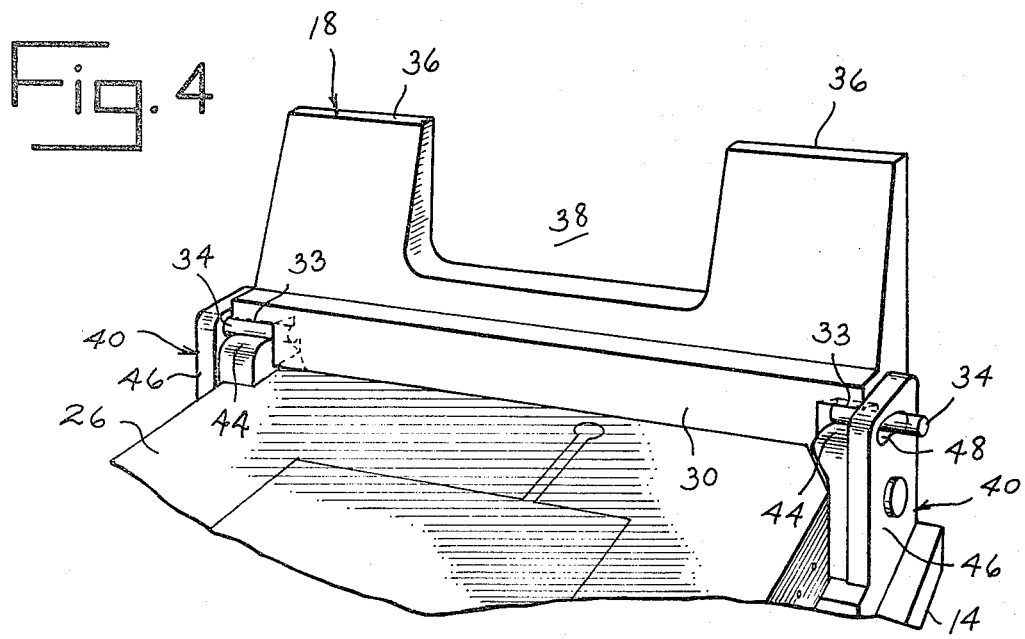

INTEGRATED CIRCUIT CARRIER CONNECTOR

BACKGROUND OF THE INVENTION

This invention relates generally to an electrical connector for an integrated circuit device and will have specific application to a socket for receiving the integrated circuit chip carrier.

No explanation need be given to the importance of integrated circuits in the electronics industry. Such circuits have, over the last few years, completely revolutionized and re-oriented the field of electrical technology. Integrated circuits in their miniaturized form are made into chips. These chips are in turn normally mounted to carriers. Recently leadless chip carriers, which are of relative thin plate form having multiple leads formed upon the plate, have been utilized over other types of carrier packages such as the dual-in-line due to their compactness. Leadless chip carriers take up less space on printed circuit boards which is of importance in compact electronic circuitry design.

Such leadless chip carriers are formed of ceramic materials which have a thermal coefficient of expansion not ideally suited for the epoxy/glass material from which printed circuit boards are normally constructed. Therefore, in order to utilize leadless chip carriers, a receiving device is used to connect the carrier onto the printed circuit board. These receiving devices, or connectors, are designed to accommodate the differential in thermal expansion of the carriers and printed circuit boards. Connectors are also utilized in testing carriers with their chips prior to production usage and have been developed to accommodate such carriers for purposes of burn-in and similar testing.

U.S. Pat. Nos. 4,220,383; 4,130,327 and 3,942,854 are illustrative of electrical connectors for carriers having hinged hold-down devices for securing the carrier. The hold-down or clamping mechanisms by which the carriers are secured within the connectors of these patents are generally cumbersome to utilize, many times requiring two hands for loading and unloading. Additionally, in many constructions the hold-down clamp is a separable component of the connector, which further contributes to the lack of ease of its usage.

SUMMARY OF THE INVENTION

In this invention, the electrical connector for the carrier is designed with a pair of opposing pivoted latches having open centers to facilitate insertion and removal of the carrier from the connector. The connector frame to which the latches are connected may also have an open center which in combination with the openness of the latch construction allows the socket to be advantageously utilized for heat sink and test usage. The latches utilize a shiftable over-center securing technique which permits them to be closed or opened with one hand as well as to be adapted for automated loading and unloading of the carriers.

Accordingly, it is an object of this invention to provide an electrical connector for an integrated circuit chip carrier which is of simple and reliable operation.

Another object of this invention is to provide an electrical connector which is for integrated circuit chip carriers and which can be simply adapted for automated loading and unloading.

Still another object of this invention is to provide a socket which is for leadless chip carrier and which is of versatile usage and simple operation.

And still another object of this invention is to provide a socket which is for leadless chip carriers and which can be loaded and unloaded by an operator utilizing one hand.

Other objects of this invention will become apparent upon a reading of the invention's description.

BRIEF DESCRIPTION OF THE DRAWINGS

A preferred embodiment of this invention has been chosen for purposes of illustration and description wherein:

FIG. 3 is a fragmentary perspective view showing one latch of the connector being separated for illustrative purposes from the connector frame.

FIG. 4 is a fragmentary perspective view showing the latch connected to the frame of the connector and in open position in preparation for closing over the carrier.

DESCRIPTION OF THE PREFERRED EMBODIMENT

The preferred embodiment illustrated is not intended to be exhaustive or to limit the invention to the precise form disclosed. It is chosen and described in order to best explain the principles of the invention and its application and practical use to thereby enable others skilled in the art to best utilize the invention.

Figure 2:
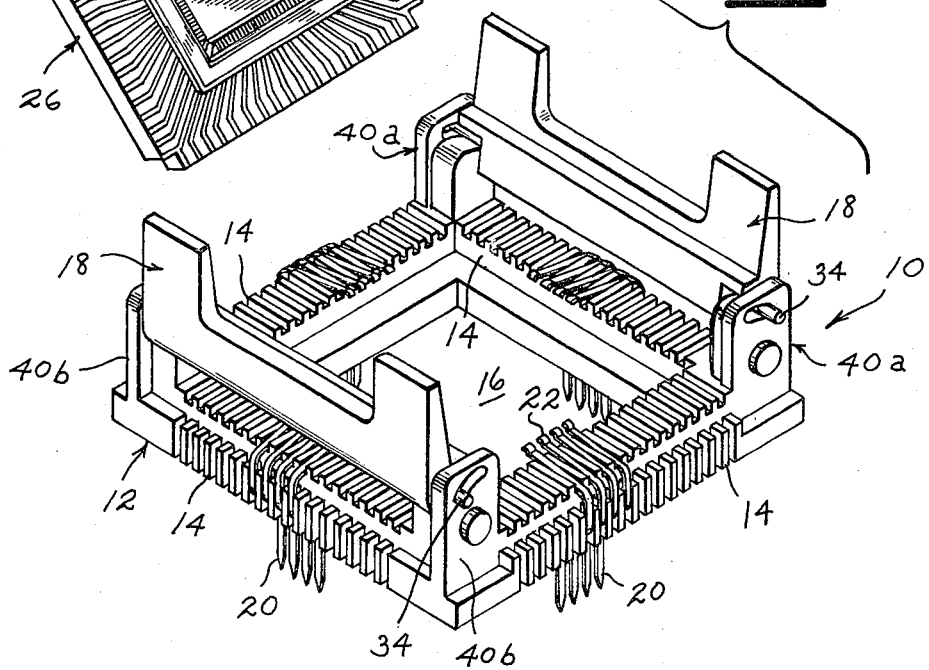
FIG. 2 is a perspective view of the connector shown opened with the carrier removed.

Connector 10, as perhaps best illustrated in FIG. 2, includes a frame 12 having four side members 14. In the illustrated embodiment, side members 14 are shown to be of equal length, forming a square in joined association with an open center 16. A pair of latches 18 is pivotally connected to connector frame 12 at the corners of the frame. Frame side members 14 include slotted exterior side walls into which are fitted contacts 20. Each contact 20 includes a cantilevered spring part 22 which projects above the upper surface of the side members 14 and which serves to make electrical contact with a surface lead 24 of the carrier 26 as it is inserted into connector 10. The number and placement of contacts 20 along frame side members 14 will vary depending upon the number and location of chip-connected leads 24 on carrier 26. An integrated circuit chip 28 is positioned within the center of carrier 26 and has its leads appropriately connected to selected carrier leads 24.

Each latch 18 includes a central shoulder 30 having a cutout 32 at each end. Coaxial pivot pins 34, forming pintles, protrude from shoulder 30 through cutouts 32. Spaced tabs 36 extend from shoulder 30 to form levers. A lip 33 is formed at the end of each latch shoulder 30 within the cutout 32 there. With latches 18 pivotally connected to frame 12 of connector 10, the opening 38 between tabs 36 of each latch permits generally unrestricted access to the center of an inserted carrier 26 to allow for testing or heat sink connections and for ease of removal of the carrier.

Connector frame 12 includes four corner posts 40 structurally formed into a post pair 40a and 40b. Each corner post 40 is of like construction except for opposing orientations across frame 12 and carrier positioning parts to be later described. Each post 40 includes an interior cam surface 44 and an exterior guide part 46 which defines an arcuate slot 48 located spacedly above cam surface 44. Slot 48 extends upwardly and in a direction towards the opposite end of frame 12. A latch 18 is retained in pivoted association between each pair of corner posts 40a, 40b with its pins 34 extending through slots 48 of the post guide parts 46 and with its central shoulder 30 extending between surfaces 44 of the posts. For ease of assembly, guide parts 46 of posts 40 can be attached to the body of cam surface 44 by means of screws or pins which allows the guide parts to be removed and to be resecured to frame 12 during assembly or replacement of latches 18.

With pins 34 of each latch 18 projecting through slots 48 of its supporting corner posts 40, each pin extends over a post cam surface 44 located within cutout 32 of the latch shoulder 30.

Figure 5:
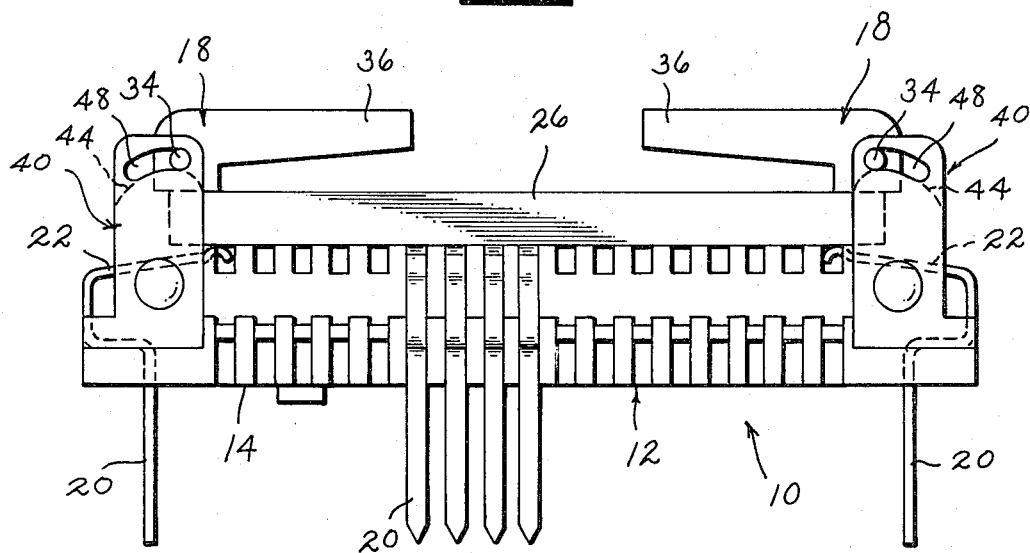
FIG. 5 is a side view of the connector shown with the carrier secured therein.
Figure 6:
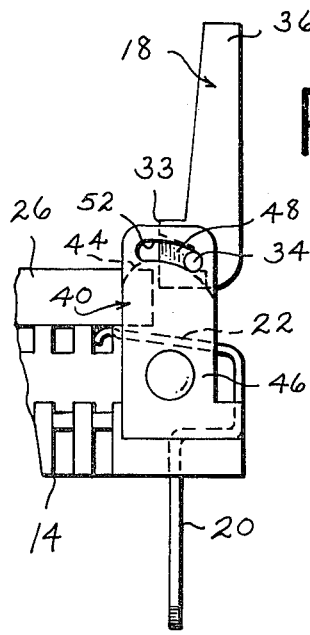
FIG. 6 is a fragmentary sectional view showing one latch of the connector in its full open position in preparation for securing the carrier within the connector frame.
Figure 7:
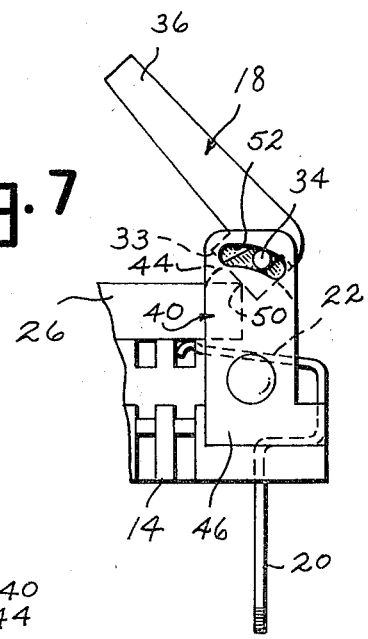
FIG. 7 is a sequential view of FIG. 6 showing the latch in an intermediate position initially contacting the carrier supported within the connector frame.
Figure 8:
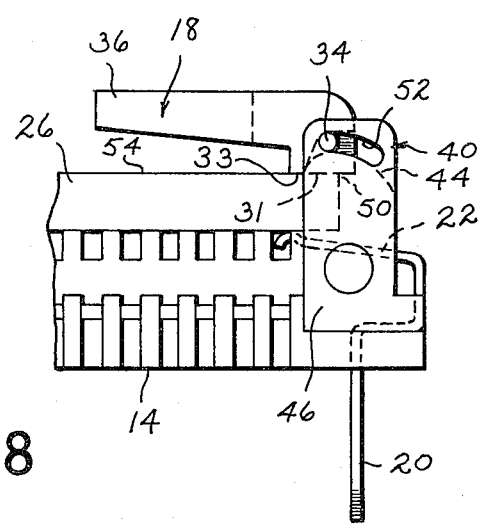
FIG. 8 is a sequential view of FIG. 7 showing the latch in its full closed position over the carrier.

The manner in which latches 18 serve to secure carrier 26 within frame 12 of connector 10 can best be seen and appreciated in FIGS. 6–8. These figures show the sequential operative steps by which the carrier 26 is locked within frme 12. Each latch 18 is shiftable within its supporting post guide slots 48 from an upright, full open position, as seen in FIGS. 2 and 6 to the closed, latched or locked position, as seen in FIGS. 5 and 8. When latches 18 are in their full open position, pins 34 of the latches rest at the distal ends of slots 48 of posts 40 with shoulders 30 of the latches being shifted laterally outwardly sufficiently far enough to allow carrier 26 to be inserted into the center of frame 12 and into engagement with contact spring parts 22 without contacting any part of the latches. With carrier so positioned within frame 12 and resting upon contacts 20, each latch 18 is pivoted from its full open position inwardly by grasping handle tabs 36. As each latch 18 is pivoted inwardly to the position shown in FIG. 7, its pins 34 will ride over cam surfaces 44 of the supporting corner posts 40. When shoulder 30 of the latch makes initial contact with edge 50 of carrier 26, the latch will be forced upwardly with its pins 34 now contacting the upper surfaces 52 of slots 48 in guide parts 46 of the corner posts. As each latch 18 is further pivoted toward its closed position, shoulder 30 of the latch rides over corner 50 of the carrier 26 and latch lips 33 contact and slide over post cam surfaces 44, causing the carrier to be forced downwardly against the yielding pressure of spring parts 22 of contacts 20. Throughout the movement of each latch 18 from its intermediate position shown in FIG. 7 and to its closed position shown in FIG. 8, pins 34 of the latch contact upper surfaces 52 of guide part slots 48 of the corner posts with each latch moving in a lateral inward direction relative to frame 12. As shoulder 30 of each latch 18 overrides corner 50 of carrier 26 and latch lips 33 guide over post cam surfaces 44, the latch pins 34 are brought into an overcenter position causing the flat 31 of shoulder 30 to come to rest against the upper surface 54 of the carrier in the secured, closed position illustrated in FIG. 8. The spring pressure of contacts 20 against the opposite surface of carrier 26 will cause each latch 18 to remain in its closed position until the latch is pivoted outwardly into its open position.

Figure 1:
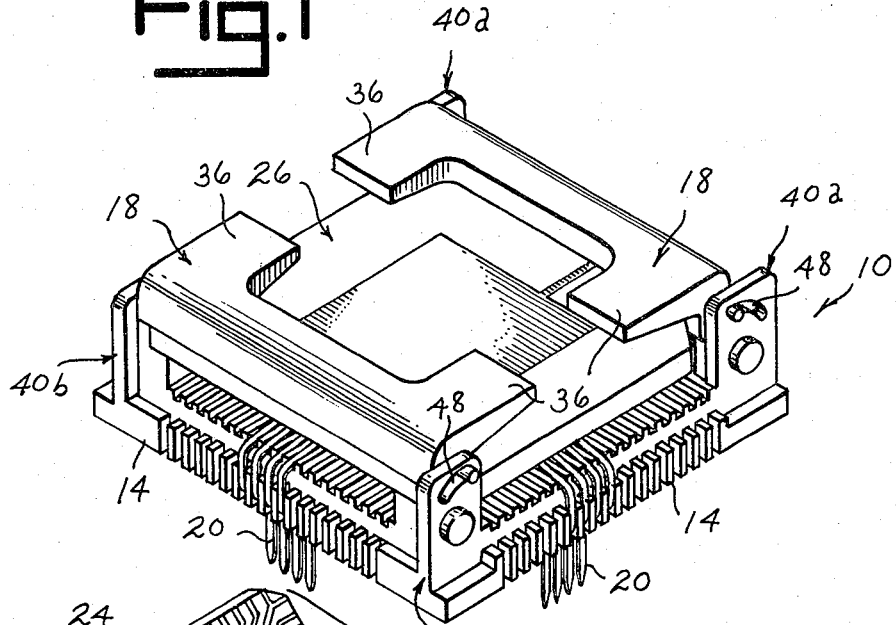
FIG. 1 is a perspective view of the connector having the carrier secured therein.

As mentioned previously, and as best seen in FIGS. 1 and 5, the open center of latches 18 between tabs 36 allow access to the center of carrier 26 when the carrier is secured within frame 12 of the conductor. Latches 18 need not be simultaneously closed but may be shifted individually from their full open into their closed positions with the use of one hand.

To release carrier 26, each latch 18 is simply pivoted from its closed into its full open position in a manner reverse to that described for securing the carrier within the frame 12. Again, each latch 18 may be individually opened by one hand. Lever tabs 36 of latches 18 and the position of such tabs in a spaced location above carrier 26 allow for easy removal of the carrier as well as the adaption of the connector to automated loading and unloading. When carrier 26 is loaded or secured within frame 12 of connector 10, contacts 20 of the connector are exposed to allow for cooling and any desired electrical test connections. While it is anticipated that frame 12 and latches 18 of connector 18 will be of a non-metallic construction, guide parts 46 of corner posts 40 and latch pins 34 can be of a metallic construction to serve as heat sink reservoirs.

To assure proper orientation of carrier 26 within frame 12, three corners of the carrier are notched to fit between surfaces 44 of the corner posts 40. One corner of carrier 26 is not notched so as to assure correct rotative orientation of the carrier with a mating complementary surface 60 at one of the corner posts 40.

It is to be understood that the invention is not to be limited to the details above given but may be modified within the scope of the appended claims.

What we claim is:

1. An electrical connector for an integrated circuit carrier having a lower surface with leads thereon and an upper surface, said connector comprising a frame having four corners, spring contacts carried by said frame, a post extending upwardly at each of said corners, each post having a guide part, two of said posts at adjacent corners of the frame constituting a first pair of posts, the remaining two posts constituting a second pair of posts oppositely located from said first post pair, said guide part of one post and said guide part of the other post of each post pair being spacedly opposed, a pair of latches, each latch including a central shoulder and pintle end parts, each post guide part defining arcuate path extending from a distal end upwardly and toward the opposite pair of posts to a near end, a said latch extending between each post pair with its pintle end parts being journaled in said post guide parts of the post pair, each latch being rotatable within and shiftable along said journaling post guide parts and having an open position adjacent said guide parts distal ends with its central shoulder in a generally vertical position to allow said carrier to be placed within and removed from said frame and a closed position adjacent said post guide parts near ends with its central shoulder in a generally horizontal position in contact with said carrier upper surface to urge the carrier within said frame into engagement with said spring contacts at its said leads.

2. The electrical connector of claim 1 wherein each post includes a cam surface downwardly offset from the guide part of the post, each latch including a spaced lip located adjacent each pintle end part thereof, each lip being located above a post cam surface as each latch extends between a post pair, each lip contacting its underlying post cam surface as said latch thereof is shifted into its closed position and constituting means for positioning the pintle end parts of the latch in an overcenter position relative to said carrier when the latch is in its closed position.

3. The electrical connector of claim 2 wherein said central shoulder of each latch is of reduced transverse dimension at each end to define said lips, each lip extending forwardly of its adjacent pintle end part.

4. The electrical connector of claim 1 wherein each guide part has a slot defining said arcuate path therein, a said latch pintle end part journaled in said slot.

* * * * *